United States Patent [19]
Eckel, Jr. et al.

[11] Patent Number: 5,442,176
[45] Date of Patent: Aug. 15, 1995

[54] INFRARED DETECTOR ARRAY

[75] Inventors: Robert A. Eckel, Jr., Andover; Ronald R. Kusner, Harvard; Daniel Y. Ang, Quincy, all of Mass.

[73] Assignee: Raytheon Company, Lexington, Mass.

[21] Appl. No.: 132,516

[22] Filed: Oct. 6, 1993

[51] Int. Cl.⁶ .......................................... H01L 27/146
[52] U.S. Cl. .................. 250/338.4; 250/332; 250/349
[58] Field of Search ...................... 250/338.4, 349, 332

[56] References Cited

U.S. PATENT DOCUMENTS

| | | | |
|---|---|---|---|
| 4,902,895 | 2/1990 | Hanson | 250/338.2 |
| 5,038,026 | 8/1991 | Krause | 250/208.1 |
| 5,268,576 | 12/1993 | Dudley | 250/332 |

Primary Examiner—Constantine Hannaher
Attorney, Agent, or Firm—Donald F. Mofford; William R. Clark

[57] ABSTRACT

An infrared detector array having a plurality of infrared detectors arranged in a matrix of rows and columns in a first semiconductor body; and, a plurality of integration/read circuits arranged in a matrix of rows and columns in a second semiconductor body, each one of the plurality of integration/read circuits being in vertical registration with, and electrically connected to, a corresponding one of the plurality of detectors. Each one of the integration/read circuits includes: a capacitor; a first transistor, electrically coupling the capacitor and the corresponding one of the detectors during an integration mode, for enabling current generated in the detector in response to impinging radiation to pass from the detector to the capacitor for integration; and a second transistor, electrically coupling the charge built-up on the capacitor during the integration mode to an output bus during a subsequent read mode. A reset circuit, laterally displaced from the integration/read circuitry, is coupled to the output bus, for discharging the charge built-up on the capacitor during the integration mode and for discharging charge generated in the detector during a subsequent reset mode.

11 Claims, 3 Drawing Sheets

INFRARED DETECTOR ARRAY

BACKGROUND OF THE INVENTION

This invention relates generally to infrared detector arrays and more particularly to infrared detector array structures wherein the array of infrared detectors and associated electronic detector integration/read circuits are formed as a hybrid integrated circuit.

As is known in the art, infrared detectors are used in a wide range of applications. In one application, an array of the detectors are used as sensors to detect the infrared energy emitted by objects in a scene under observation. Each detector generates an electrical charge in response to the portion of the emitted energy it detects. Circuitry is provided for converting the generated charge into a corresponding electrical signal. The electrical signals are combined by a processor which produces a corresponding visual image of the observed scene. Thus, each detector provides the data for a corresponding pixel of the produced visual image.

In one arrangement, an optical system focuses the emitted infrared energy into a corresponding image on the focal plane of the optical system. The infrared detectors are formed as an array of electrically isolated photo-diode detectors along one surface of a semiconductor chip, typically a chip of InSb or HgCdTe. The chip is disposed on the focal plane. Each photo-diode detector in the array generates an electrical current representative of the amount of infrared power focused onto it. The current is integrated by an integration circuit, typically a capacitor during an integration mode, to produce an electrical signal representative of the infrared energy impinging the photo-diode detector. The integrated signal is read out and passed to the processor during a subsequent read mode. Finally, any residual charge generated in the photo-diode detector, as well as the charge built-up on the capacitor, are removed before the next address cycle during a reset mode.

In one arrangement, the integration/read circuit, as well as a reset circuit, is formed as an integrated circuit in a second semiconductor chip, typically Si. More particularly, an array of integration/read circuit, as well as the reset circuits, is arranged in a matrix of rows and columns formed in the second semiconductor chip. Each one of the circuits is disposed in vertical alignment, or registration with, and is electrically connected to, a corresponding one of the photo-diode detectors. Thus, the first and second semiconductor chips are disposed in overlaying parallel planes. This arrangement allows for the direct electrical connection between each photo-diode detector and its associated integration/read circuit, as well as its associated reset circuit. An exemplary one of the circuits is shown in FIG. 1 as circuit 10'.

The exemplary circuit 10' is shown connected to a photo-diode detector 12'. The diode detector 12' is formed in a region 13' of the first semiconductor chip 14', and the circuit 10' is formed in a region 16' of the second semiconductor chip 18'. It is noted that the region 16' of second chip 18' where the circuit 10' is formed in vertical alignment with the region 13' where the diode detector 12' is formed in the first semiconductor chip 14'. The circuit 10' includes five field effect transistors, $F_1$, $F_2$, $F_3$, $F_4$, and $F_5$, arranged as shown, and a capacitor $C'_{int}$. During all three modes (i.e., the integration mode, the read mode, and the reset mode), a bias voltage, $V_{bias}$, is applied to the gate electrode of transistor $F_4$ to bias such transistor $F_4$ into conduction, for reasons to be discussed. Further, the circuit 10' is supplied by a drain voltage supply $V_{dd}$ and a source voltage supply $V_{ss}$, as indicated. During the integration mode, transistor $F_1$ is switched "on" by a set voltage, $V_{set}$, fed to the gate electrode thereof, while transistors $F_3$ and $F_2$ are switched "off" by $V_{reset}$ and $V_{read}$ logic signals fed to the gate electrodes of transistors $F_3$ and $F_2$, respectively. Thus, charge generated in the photo-diode detector 12' in response to impinging infrared radiation is fed, via transistors $F_1$ and $F_4$, to the capacitor $C_{int}$ for integration. Therefore, during this integration mode, transistors $F_1$ and $F_4$ are in conducting conditions, and transistors $F_2$ and $F_3$ are in non-conducting conditions. After a predetermined integration time, transistor $F_2$ is switched "on". The voltage built-up by capacitor $C_{int}$ and the gate electrode capacitance of transistor $F_5$ produces a corresponding voltage on the source electrode of such transistor. When transistor $F_2$ is switched "on" during the read mode, the voltage on the source electrode of transistor $F_5$ produces a corresponding voltage on the source electrode of the transistor $F_2$ which is coupled to an output bus 19'. During the subsequent reset mode, a $V_{reset}$ logic signal is fed to the gate electrode of transistor $F_3$ to place such transistor in an "on" condition while the logic signal $V_{read}$ on the gate electrode of transistor $F_2$ turns such transistor $F_2$ to an "off" condition. Therefore, during the reset mode, charge built-up on the capacitor $C_{int}$ discharges to $V_{ss}$ through the source and drain electrodes of transistor $F_3$. Likewise, any charge generated in the photo-diode detector 12' is also discharged to $V_{ss}$ through the source and drain electrodes of transistors $F_1$, $F_3$, and $F_4$. It is noted that because of the bias on transistor $F_4$ switching transients coupled through any parasitic gate-drain capacitance of transistor $F_3$ and remaining channel charge of transistor $F_3$ (and appearing on the drain of such transistor $F_3$) is attenuated prior to passing to the diode detector 12'. That is, transistor $F_4$ acts as a buffer, or isolation device, and attenuates transients resulting from a change in the $V_{reset}$ logic state of the signal on the gate of transistor $F_3$ from passing to the diode detector 12'. The voltage on the gate electrode of transistor $F_1$ is selected to not only place such transistor $F_1$ in a conducting condition; but, as noted above, is also selected to apply an appropriate reverse bias voltage to the diode detector 12'. Since the circuit 10' is formed in the region 16' of the silicon chip 18' disposed in vertical alignment with the diode detector device 12' connected to it, in order to reduce the amount of spacing between adjacent photo-diode detectors (and thereby increase array resolution), or alternatively, in order to increase the size of the integration capacitor $C_{int}$ used in the circuit (and thereby increase detection sensitivity), it is desirable to reduce the number of active devices (i.e., transistors) required to implement the circuit 10'.

SUMMARY OF THE INVENTION

With this background of the invention in mind, it is therefore an object of this invention to provide an improved infrared detector array.

It is another object of this invention to provide an improved infrared detector array of the type having a first semiconductor chip providing an array of infrared detectors and a second semiconductor chip having formed therein a plurality of integration/read circuits, each one thereof being directly connected to a corresponding one of the diode detectors to provide a hybrid integrated circuit.

These and other objects of the invention are obtained generally by providing: an infrared detector array having a plurality of infrared detectors arranged in a matrix of rows and columns in a first semiconductor body; and, a plurality of integration/read circuits arranged in a matrix of rows and columns in a second semiconductor body, each one of the plurality of integration/read circuits being in vertical registration with, and electrically connected to, a corresponding one of the plurality of detectors. Each one of the integration/read circuits includes: a capacitor; a first transistor, electrically coupling the capacitor and the corresponding one of the detectors during an integration mode, for enabling electrical current generated in the detector in response to impinging radiation to pass from the detector to the capacitor for integration; and, a second transistor, electrically coupling the charge built-up on the capacitor during the integration mode to an output bus during a subsequent read mode.

In accordance with another feature of the invention, a reset circuit is coupled to the output bus, for discharging the charge built-up on the capacitor during the integration mode and for discharging charge generated in the detector during a subsequent reset mode.

In a preferred embodiment of the invention, the reset circuit is formed in a portion of the second semiconductor body laterally displaced from the portion of the second semiconductor body having formed therein the array of integration/reset circuits. The integration/read circuits are arranged in a matrix of rows and columns thereof. Each one of the columns of integration/read circuits is connected to a common output bus. A plurality of reset circuits is provided, each one thereof being coupled to a corresponding one of the column of output buses. Each one of the reset circuits includes a third field effect transistor having a gate electrode adapted for coupling to the reset signal and one of the source and drain electrodes thereof coupled to the corresponding one of the output buses. Also included is a buffer circuit disposed between the output bus and an output terminal which produces the electrical circuit for a processor. The buffer circuit, laterally displaced from the second portion of the semiconductor having the array of integration/read circuits, includes a fourth field effect transistor having a gate electrode connected to the output bus and one of the source and drain electrodes of the fourth transistor.

With such arrangement, because the transistor in the reset circuit used to discharge the capacitor during the reset mode is displaced from the region where the address circuit is formed, it is coupled to the diode detector device through a relatively long, relatively large capacitive impedance provided by a common column output bus. Therefore, the buffer transistor $F_4$ of the prior art circuit is able to be removed since switching transients produced when the reset transistor is switched to the "on" state will be buffered from the diode detector by the relatively large capacitive impedance of the column output bus. Further, the discharge of the charge stored on the integration capacitor and bus capacitance during the reset mode prior to subsequent read or integration modes, passes directly onto the column output bus through the reset circuit transistor $F_8$. Still further, in the prior art, circuit (FIG. 1), the voltage on the capacitor generates a voltage on the gate of transistor $F_5$, which in turn produces a voltage on the column output bus after the read current $I_{m\ out}$ out is switched into field effect transistor $F_5$, by transistor $F_2$. The removal of transistor $F_5$ with the invention thus inherently produces less offset and gain non-uniformity than the prior art circuit because of the elimination of the variation in the array matrix of gate-to-source voltage variations. A column-to-column gain variation is introduced by the introduction of column buffer line capacitance variations, but these variations are common to each row of a given column and are less severe than the variations induced by transistor $F_5$ variations. The column buffer offset variations of the present invention are tightly grouped from one column to the next because the physical location of the column buffer circuit is laterally displaced from the first portion of the array and the integration/reset circuits over the prior art circuit $10'$. Because of this displacement, the buffer circuit in the present invention can be made large and minimize threshold variations attributable to both junction geometry and semiconductor material property variations. The extent of the non-uniformity is now dominated by the columns relative to the column buffer circuit quality. Whereas in the prior art circuit threshold variations in transistor $F_5$, which is also dependent on junction geometry and material property variations cause a matrix of non-uniformity associated with each detector as distinguished from a tighter column distribution. For example, with a matrix of 128 rows and 128 columns of detectors geometry and material variation in transistor $F_5$ of the prior art cause $128 \times 128 = 16,384$ circuit variations whereas in the present invention the variations in geometry and material effect only 128 circuit variations.

BRIEF DESCRIPTION OF THE DRAWINGS

The aforementioned features and other advantages of the invention, as well as the invention itself, will be more fully understood from the following detailed description read together with the accompanying drawings, in which.

DESCRIPTION OF THE PREFERRED EMBODIMENT

Figure 2:
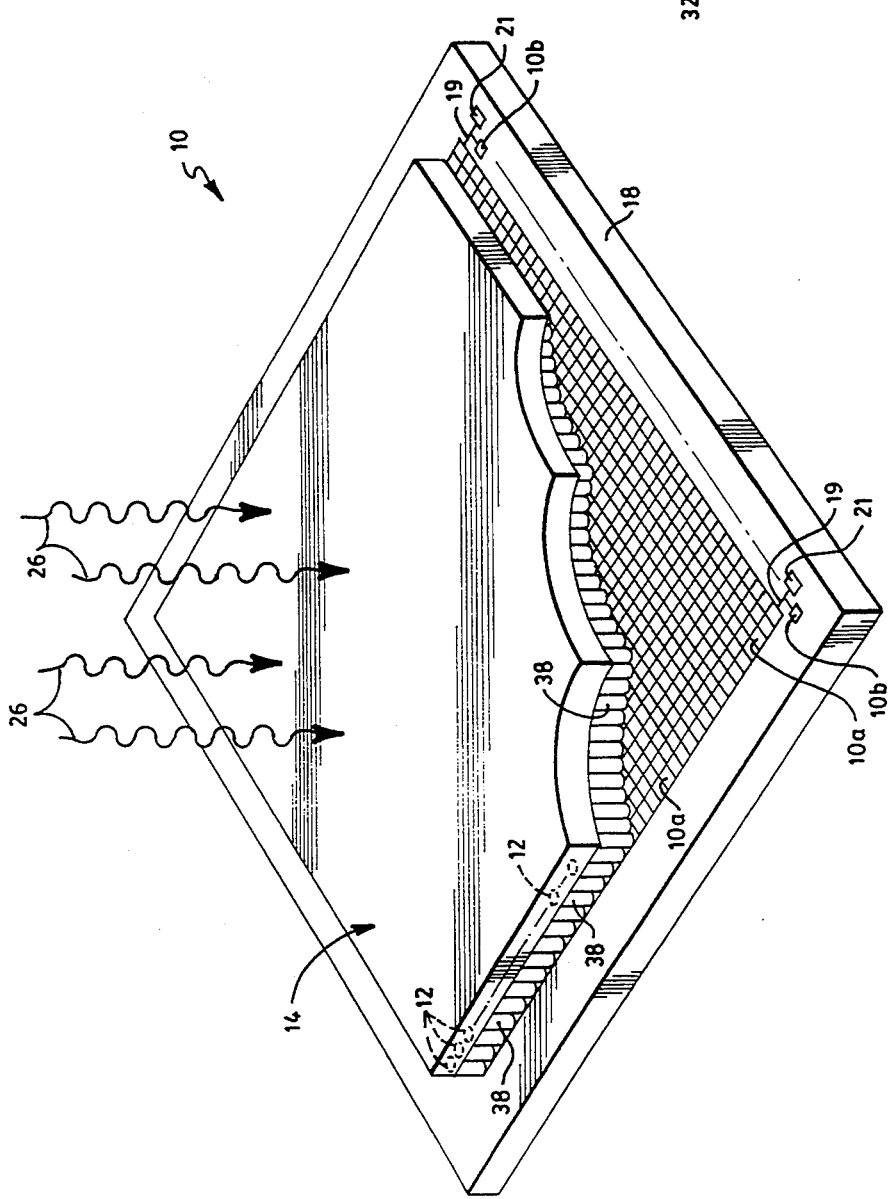
FIG. 2 is a diagrammatical sketch, partially broken away and greatly simplified, of an infrared detector array structure according to the invention.
Figure 3:
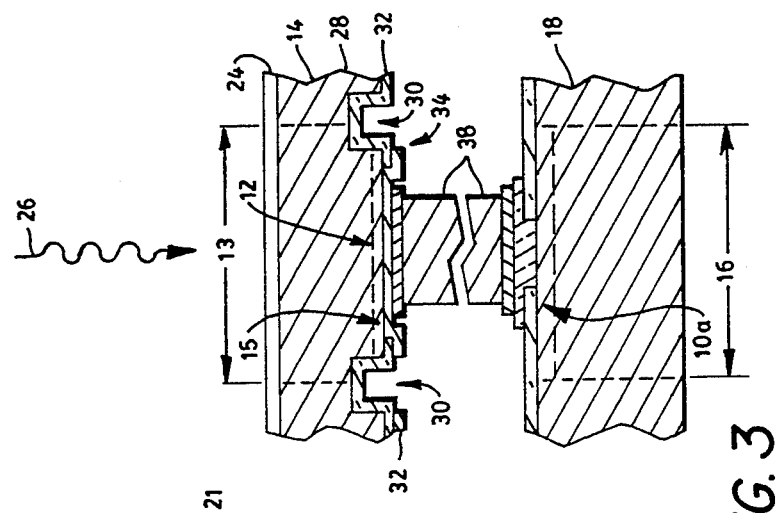
FIG. 3 is a cross-sectional view, greatly simplified, an exemplary one of the photo-diode detectors and its associated integration/reset circuit used in the structure of FIG. 2.

Referring now to FIG. 2, an infrared detector array structure 10 is shown to include a first semiconductor body or chip 14, here HgCdTe or InSb. The chip 14 has formed therein a plurality of infrared photo-diode detectors 12, an exemplary one thereof being shown in FIG. 3. The photo-diode detectors 12 are formed in a conventional manner and are arranged in a matrix of rows and columns thereof in the chip 14, as indicated in FIG. 2. Thus, as is known and referring also to FIG. 3, the chip 14 has formed on one surface thereof a passivation/anti-reflection coating or layer 24 onto which incident infrared radiation is subjected, such radiation being represented by arrows 26 in FIGS. 2 and 3. The substrate 28 of chip 14 is adapted for coupling to a suitable voltage supply, here a drain voltage supply, $V_{dd}$ (here about 0 volts), (not shown). The opposite surface of the chip 14 has formed in laterally isolated regions thereof the diode detectors 12. Each one of the active regions 15 of the photo-diode detectors 12 is isolated in a conventional manner by isolation grooves 30 and a suitable passivation/insulation layer 32, as shown in FIG. 3. The cathode of the photo-diode detector 12 is provided with an electrical contact 34, as shown.

A second semiconductor body, or chip 18, here silicon, has formed in a region thereof vertically disposed under the first chip 14, using conventional integrated circuit fabrication techniques, a plurality of integration/read circuits 10a arranged in a matrix of rows and columns thereof. Each one of the plurality of integration/read circuits 10a is in vertical alignment, or vertical registration with, and is electrically connected to, a corresponding one of the plurality of detectors 12, as shown in FIG. 3. Each detector 12 is electrically connected to its correspondingly, aligned integration/read circuit 10 by a vertical electrical connector 38, here indium. Also formed as an integrated circuit on the second chip 18 is a plurality of reset circuits 10b. It is first noted that the plurality of reset circuits 10b is formed in a different, laterally displaced region where the plurality, or matrix, of integration/read circuits 10a is formed. A plurality of columns of output buses 19 is formed on the surface of the second semiconductor chip 18. Each one of the columns of the output buses 19 connects a corresponding one of the reset circuits 10b to a column of integration/read circuits 10a, as shown more clearly in FIG. 4.

Figure 4:
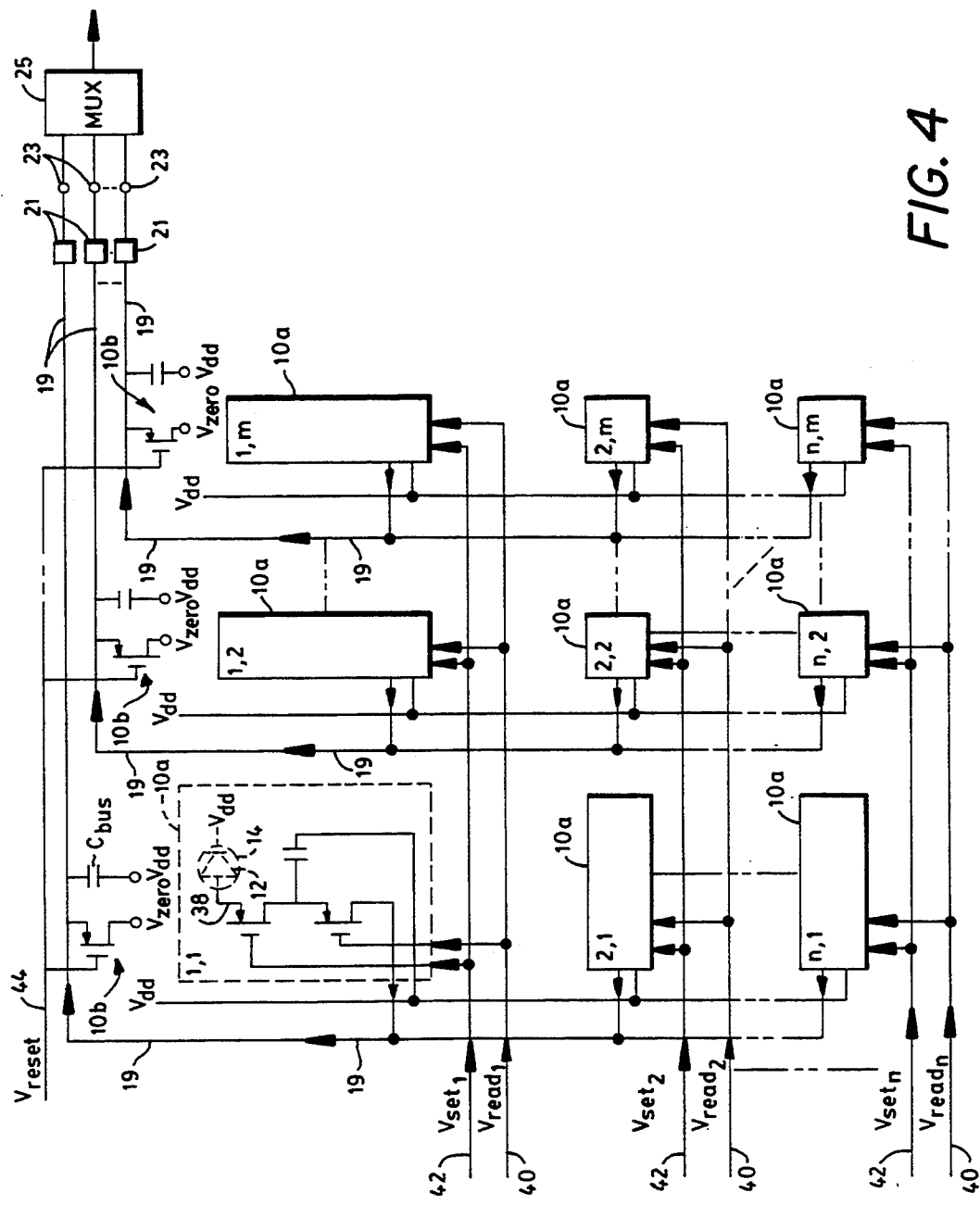
FIG. 4 is a block diagram of the integration/reset circuits, reset circuits, and interconnecting buses formed in one semiconductor chip as an integrated circuit and used in the structure of FIG. 2; an exemplary photo-diode detector formed in a second semiconductor chip and also used in such structure being shown in phantom.

Referring now to FIG. 4, the integration/read circuits 10a are shown arranged in a rectangular matrix of n rows and m columns. As discussed briefly above, each column of reset/read circuits is connected, via a column output bus 19, to a corresponding one of m reset circuits 10b. An integration/read circuit 10a and the reset circuit 10b connected to it by column output bus 19. A buffer circuit 21 is connected between each one of the column buses 19 and a corresponding output terminal 23 to multiplexer circuit 25. The electrical signals produced by column buffer circuits 21 on the output terminals 23 are fed to a multiplexer 25 to reduce the number of electrical leads to a conventional processor, not shown. (The multiplexer is controlled by the processor, not shown, in a conventional manner). Also formed on the surface of the second chip 18 is a plurality of, here n, $V_{read}$ row conductors 40, each one being connected to the integration/read circuits 10a in a corresponding one of the rows thereof, as shown in FIG. 4. The $V_{read}$ row conductors 40 feed the read logic signals described above in connection with FIG. 5, to the integration/read circuits 10a. A second plurality of n $V_{set}$ row conductors 42 is also formed on the surface of the second chip 18. Each one of the row conductors feed a set signal to the integration/read circuits 10a in the row thereof connected to such $V_{set}$ conductors 42. A reset signal is fed to the reset circuits 10b via bus 44, as shown. (It should be noted that an exemplary one of the photo-diode detectors 12 is shown in phantom to indicate that it is formed on the first chip 14).

Figure 5:
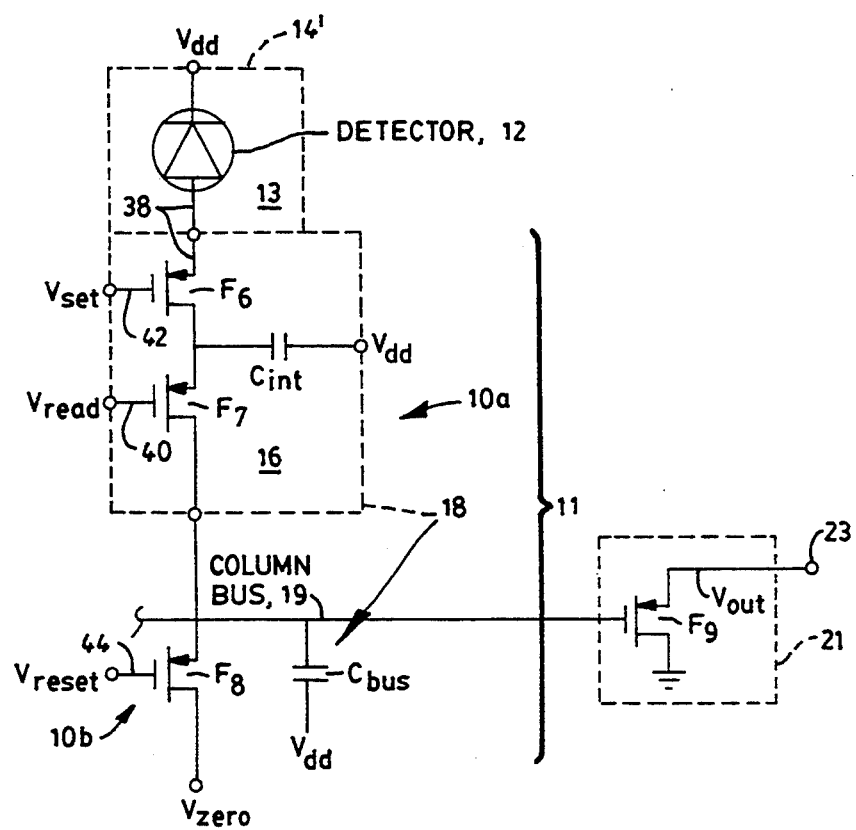
FIG. 5 is a schematic diagram of the integration/read circuit used in FIG. 2, together with its connected photo-diode detector and reset circuit.

Referring now to FIG. 5, an exemplary one of the interconnected photo-diode detectors 12, integration/read circuits 10a and reset circuits 10b are shown. It is first noted that the integration/read circuit 10a and connected reset circuit 10b together form an address circuit 11 for the connected detector 12. Thus, one of the integration/read circuits 10a includes: an integration circuit, here a capacitor $C_{int}$; a first transistor $F_6$ having source and drain electrodes serially coupled between the detector device 12 and the capacitor $C_{int}$, as shown, and a second field effect transistor $F_7$ having source and drain electrodes serially coupled between the capacitor $C_{int}$ and the column output bus 19, as shown. The reset circuit 10b includes a third transistor $F_8$ having source and drain electrodes serially coupled between the column output bus and a reference potential $V_{zero}$ (here about $-7$ volts). The column output bus 19 is coupled to output terminal 23 through buffer circuit 21. Buffer circuit 21 includes a field effect transistor $F_9$, as shown. The source and drain electrodes of transistor $F_9$ are connected between ground and the output terminal 23 that goes to the multiplexer 25. The buffer circuit 21 operates as a buffer amplifier between the column output bus 19 and the output terminal 23. A parasitic bus capacitance $C_{bus}$ from the column output bus 19 to ground, is shown.

In operation, during the integration mode, transistor $F_6$, is switched to an "on" condition by the logic signal $V_{set}$ fed to the gate electrode thereof via $V_{set}$ row conductor 42. (Here the signal $V_{set}$ swings between 0 and $-1.5$ volts). During this integration mode, transistor $F_7$ is switched to an "off" condition by the logic signal $V_{read}$ fed to the gate electrode thereof via $V_{read}$ row conductor 40. (Here the logic signal $V_{read}$ swings between about 0 volts and $-10$ volts). Thus, in the integration mode, current generated in the diode detector 12 passes through the source-drain electrodes of transistor $F_6$ to $C_{int}$ (previously charged to $-7$ volts) to charge capacitor $C_{int}$. The conducting transistor $F_6$ buffers the photo-diode detector 12 from the changing integration voltage being built-up on capacitor $C_{int}$ thus maintaining the detector 12 at a suitable bias, as determined by $V_{set}$, while also presenting an essentially constant input impedance to the photo-diode detector 12. The photo-diode detector 12 impedance should be larger than the impedance of transistor $F_6$ and variations in detector currents, combined with bias voltage sensitivities should be small.

After a predetermined integration time, transistor $F_6$ is switched to an "off" condition to terminate the integration mode. The charge is maintained on the capacitor $C_{int}$ until the initiation of the read mode for the selected circuit 10a. The read mode is initiated by switching transistor $F_7$ to an "on" condition. Transistor $F_8$ is in the "off" condition by the logic signal $V_{reset}$ on the gate electrode of such transistor via the reset bus 44. (Here the swing in $V_{reset}$ is between about 0 volts and $-10$ volts). The circuit 10 is thus placed in the read mode. More particularly, a portion of the charge built-up on capacitor $C_{int}$ is passed to the column output bus 19 via the source-drain electrodes of "on" transistor $F_7$, the remaining portion is maintained on the capacitor $C_{int}$. The portion of the charge coupled to bus 19 is equal to the total charge initially stored on capacitor $C_{int}$ times the ratio of the capacitance of the integration capacitor $C_{int}$ to the sum of the capacitance of bus 19, $C_{bus}$, and the capacitance of the integrating capacitor, $C_{int}$. The signal on the column output bus 19 is then passed to the column buffer circuit 21 and the multiplexer 25 to the processor, not shown. Next, transistor $F_8$ is switched to the "on" condition (transistor $F_7$ remaining in the "on" condition and transistor $F_6$ being turned "on"), thereby placing the circuit 10 in the reset mode. In such reset mode, charge built-up on the capacitor $C_{int}$ is discharged to $V_{zero}$, via the source-drain electrodes of transistors $F_7$ and $F_8$. It is also noted that the bus capacitance, $C_{bus}$, is reset to $V_{zero}$. The voltage $V_{zero}$ sets the starting voltage on the integration capacitor $C_{int}$ and the bus capacitance $C_{bus}$. It is also noted that any charge generated in the diode detector is also discharged to $V_{zero}$ via the source-drain electrodes of "on" transistors $F_6$, $F_7$, and $F_8$. If necessary, the discharge of the charge in the detector can be enhanced by turning transistor $F_6$ "on" harder during the reset mode with a lower voltage $V_{set}$ than that applied during the integration mode.

Figure 1:
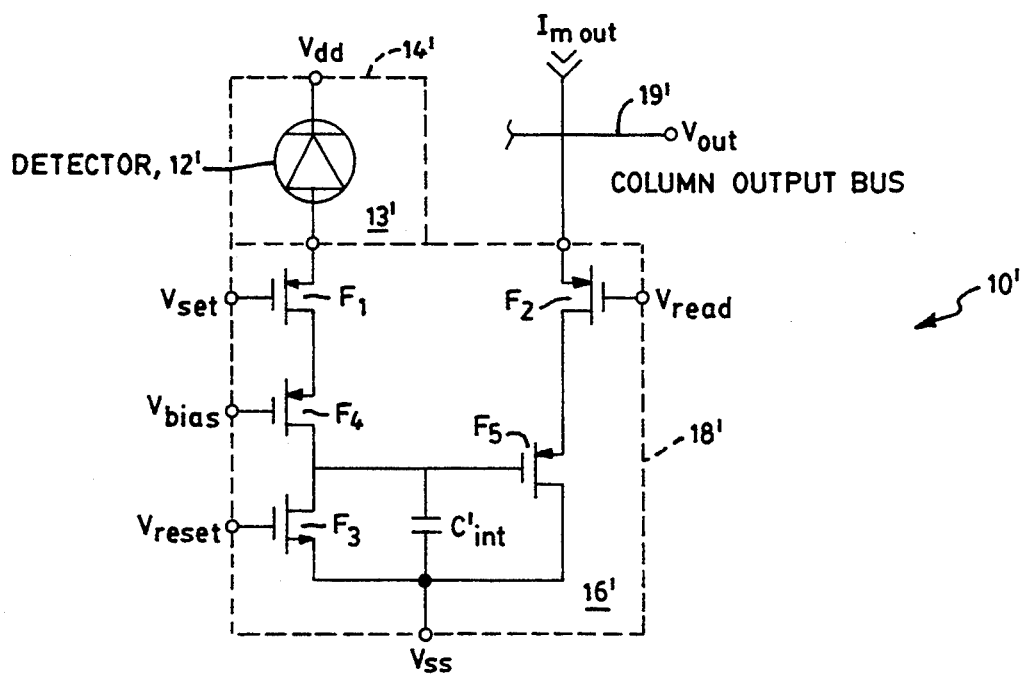
FIG. 1 is a schematic diagram of an address circuit for a photo-diode detector according to the PRIOR ART.

With such arrangement, because the transistor $F_8$ in the reset circuit 10b used to discharge the capacitor $C_{int}$ during the reset mode is displaced from the region where the integration/read circuit 10a is formed and is coupled to the diode detector 12 though a relatively long (i.e., about 0.25 inches ($128 \times 128$ 50 micrometers per device), or greater, compared with about 10 microns in the circuit 10 shown in FIG. 1), relatively large capacitive impedance of the common column output bus 19, switching transients produced when the transistor $F_8$ is switched to the "on" state will therefore be buffered from the diode detector 12 by the relatively large capacitive impedance of the column output bus 19. Further, the charge stored on the capacitor $C_{int}$ passes directly onto the column output bus 19 without passing through an additional matrix buffer transistor such as transistor $F_5$ of the prior art circuit in FIG. 1. Thus, there is inherently less non-uniformity than the prior art arrangement because of the elimination of the variation in gate-to-source voltage variations due to geometry and process variations of the relatively small transistor $F_5$ of the prior art circuit 10'.

Having described a preferred embodiment of the invention, it will now be apparent to one of skill in the art that other embodiments incorporating its concepts may be used. It is felt, therefore, that this invention should not be restricted to the disclosed embodiment but rather should be limited only by the spirit and scope of the appended claims.

What is claimed is:

1. An infrared detector array, comprising:
   a first semiconductor body;
   a plurality of infrared detectors arranged in a matrix of rows and columns and formed in the first semiconductor body;
   a second semiconductor body;
   a plurality of integration/read circuits arranged in a matrix of rows and columns and formed in the second semiconductor body, each one of the plurality of integration/read circuits being in registration with, and electrically connected to, a corresponding one of the plurality of detectors, each one of the plurality of integration/read circuits comprising:
   a first field effect transistor coupled to a corresponding one of the infrared detectors;
   a capacitor connected in parallel with the first field effect transistor and the corresponding one of the infrared detectors; and
   a second field effect transistor serially coupled between the first field effect transistor and a column output bus; and
   a plurality of reset circuits, each one associated with a corresponding one of the columns of integration/read circuits, such reset circuits being formed in the second semiconductor body laterally displaced from the integration/read circuits.

2. The array recited in claim 1 wherein the reset circuit discharges the charge built-up on the capacitor during the integration mode and for discharging charge generated in the detector during a subsequent reset mode.

3. The array recited in claim 2 including a buffer circuit coupled between the reset circuit and an output terminal.

4. The array recited in claim 3 wherein the integration/read circuits are arranged in a matrix of rows and columns thereof, each one of the columns of integration/read circuits being connected to a respective column output bus.

5. The array recited in claim 4 wherein each one of the plurality of the reset circuits is coupled to a corresponding column output bus.

6. The array recited in claim 5 wherein each one of the reset circuits includes a third field effect transistor having a gate electrode adapted for coupling to the reset signal and one of the source and drain electrodes coupled to the corresponding one of the output buses.

7. An infrared detector array, comprising:
   a first semiconductor body;
   a plurality of infrared detectors arranged in a matrix of rows and columns and formed in the first semiconductor body;
   a second semiconductor body;
   a plurality of rows of read address buses formed on the second semiconductor body;
   a plurality of columns of output buses formed on the second semiconductor body;
   a plurality of integration/read circuits arranged in a matrix of rows and columns and formed in a first portion of the second semiconductor body, each one of the plurality of circuits being in registration with, and electrically connected to, a corresponding one of the plurality of detectors, each one of the columns of the plurality of circuits being coupled to a corresponding one of the plurality of columns of output buses and each one of the rows of the plurality of circuits being connected to a corresponding one of the rows of read address buses, each one of such circuits comprising:
   a charge storage device;
   means, electrical coupled between the charge storage device and the corresponding one of the detectors, for enabling current generated in the detector in response to infrared power impinging upon the corresponding one of the detectors to pass to the charge storage device during an integration mode and for buffering the corresponding one of the detectors from the charge storage device and for enabling charge built-up on the charge storage device during the integration mode to pass to the corresponding one of the plurality of column buses coupled to such one of the circuits in response to a read select signal applied to the corresponding one of the plurality of rows coupled to such one of the address buses during a read mode; and a plurality of reset circuits, each one thereof coupled to a corresponding one of the plurality of column buses, for discharging the charge built-up on the one of the plurality of storage devices coupled thereto in response to a reset signal fed to such one of the plurality of reset circuits subsequent to the read mode.

8. The array recited in claim 7 wherein the plurality of reset circuits is formed in a second portion of the second semiconductor body.

9. The array recited in claim 8 wherein each one of the integration/read circuits comprises:

a first field effect transistor having a gate electrode adapted for coupling to a set signal fed thereto during the integration mode, and source and drain electrodes serially coupled between the charge storage device and the corresponding one of the detectors coupled to such one of the integration/read circuits; and a second field effect transistor having a gate electrode coupled to the corresponding one of the plurality of row buses coupled to such one of the integration/read circuits and source and drain electrodes serially coupled between the charge storage device and the one of the plurality of column buses coupled to such one of the integration/read circuits.

10. The array recited in claim 9 wherein each one of the plurality of reset circuits comprises a third field effect transistor having a gate electrode adapted for coupling to the reset signal and one of the source and drain electrodes thereof coupled to the one of the plurality of column buses coupled to such one of the resets circuits.

11. An infrared detector array comprising:

a first semiconductor body;

a plurality of infrared detectors arranged in a matrix of rows and columns and formed in the first semiconductor body;

a second semiconductor body;

a plurality of integration/read circuits arranged in a matrix of rows and columns and formed in the second semiconductor body, each one of the plurality of integration/read circuits being in registration with, and electrically connected to, a corresponding one of the plurality of detectors, each one of the plurality of integration/read circuits comprising:

a capacitor means for buffering and selectively coupling the corresponding one of the plurality of detectors to the capacitor; and means for selectively coupling the capacitor to a column output bus; and a plurality of reset circuits, each one associated with a corresponding one of the columns of integration/read circuits, such reset circuits being disposed in the second semiconductor body remotely from the integration/read circuits.

* * * * *